United States Patent [19]
Yang Lee

[11] Patent Number: 5,174,780
[45] Date of Patent: Dec. 29, 1992

[54] SLANT SOCKET FOR MEMORY MODULE

[76] Inventor: Su-Lan Yang Lee, 4th Floor, No. 506-2, Yuan-San Road, Chung-Ho City, Taipei Hsien, Taiwan

[21] Appl. No.: 788,965

[22] Filed: Nov. 7, 1991

Related U.S. Application Data

[63] Continuation-in-part of Ser. No. 677,561, Mar. 29, 1991, Pat. No. 5,061,200, and a continuation-in-part of Ser. No. 766,385, Sep. 27, 1991.

[30] Foreign Application Priority Data

Sep. 20, 1991 [TW] Taiwan .................. 80211753

[51] Int. Cl.⁵ .......................................... H01R 13/00
[52] U.S. Cl. ..................... 439/326; 439/571
[58] Field of Search .............. 439/296, 326–328, 439/629–637, 567, 571

[56] References Cited

U.S. PATENT DOCUMENTS

| | | |
|---|---|---|
| 3,848,952 | 11/1974 | Tighe . |
| 4,136,917 | 1/1979 | Then et al. . |
| 4,575,172 | 3/1986 | Wales et al. . |
| 4,713,013 | 12/1987 | Rignier et al. . |
| 4,737,120 | 4/1988 | Grabbe et al. . |
| 4,832,617 | 5/1989 | Brown . |
| 4,850,891 | 7/1989 | Walkup . |
| 4,850,892 | 7/1989 | Clayton et al. . |
| 4,957,448 | 9/1990 | Stanevich et al. . |
| 4,995,825 | 2/1991 | Korsunsky et al. . |
| 5,004,429 | 4/1991 | Yagi et al. ............ 439/326 |
| 5,061,200 | 10/1991 | Lee . |
| 5,112,242 | 5/1992 | Choy ................... 439/326 |
| 5,123,857 | 6/1992 | Chao .................... 439/326 |

Primary Examiner—Joseph H. McGlynn
Attorney, Agent, or Firm—Lowe, Price, LeBlanc & Becker

[57] ABSTRACT

A slant memory module socket assembly including an inserting latches, retaining portions, and positioning pegs. The positioning pegs and inserting latches are injection molded and can be secured to both ends of an insulated base. The positioning pegs have at least two elastic positioning pieces which can be securely retained in holes provided in a printed circuit board in such a manner so as to maintain a gap or space "d" between the insulative housing and circuit board during a tin welding process. A pinching portion is provided which has elasticity, so that inner stress of the pinching portion and of a flexible connecting portion can be averagely dispersed to each part so that there will little possibility for either part to experience plastic deformation or transformation.

3 Claims, 11 Drawing Sheets

SLANT SOCKET FOR MEMORY MODULE

CROSS-REFERENCE TO RELATED APPLICATIONS

This application is a continuation-in-part of U.S. patent application Ser. No. 07/677,561 entitled "Stress-Dispersed Contact Element of Low Insertion Force Electrical Connector", filed on Mar. 29, 1991, and now U.S. Pat. No. 5,061,200; and of U.S. patent application Ser. No. 07/766,385 entitled "Durable Latch With Mounting Peg of Memory Module Socket", filed on Sep. 27, 1991, now pending.

FIELD OF THE INVENTION

This invention relates to a memory module socket, and more particularly a slant socket which is welded on a printed circuit board (for example, CPU board of a computer) and which can receive and retain another piece of memory module socket and which can establish an electrical interconnection with the printed circuit.

BACKGROUND OF THE INVENTION

U.S. patent application Ser. No. 07/677,561, now U.S. Pat. No. 5,061,200, discloses a contact element for a straight socket for establishing an interconnection with a memory module. Co-pending U.S. patent application Ser. No. 07/766,385, filed on Sep. 27, 1991, discloses a durable latch with a secure peg for a straight socket for latching a memory module thereon and for safely securing the straight socket on a printed circuit board. Those two parent U.S. patent applications do not provide for a slant socket.

Figure 14:
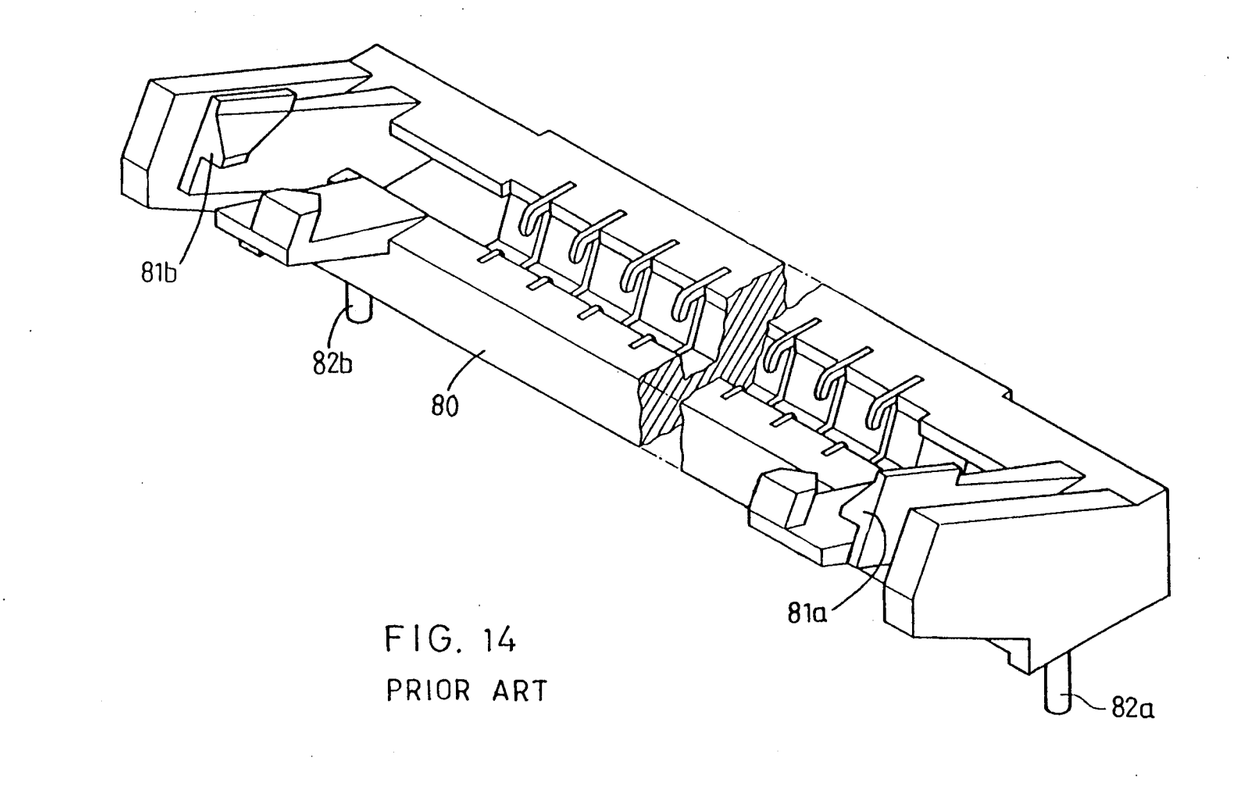
FIG. 14 is a perspective view of a prior art slant memory module socket.
Figure 15:
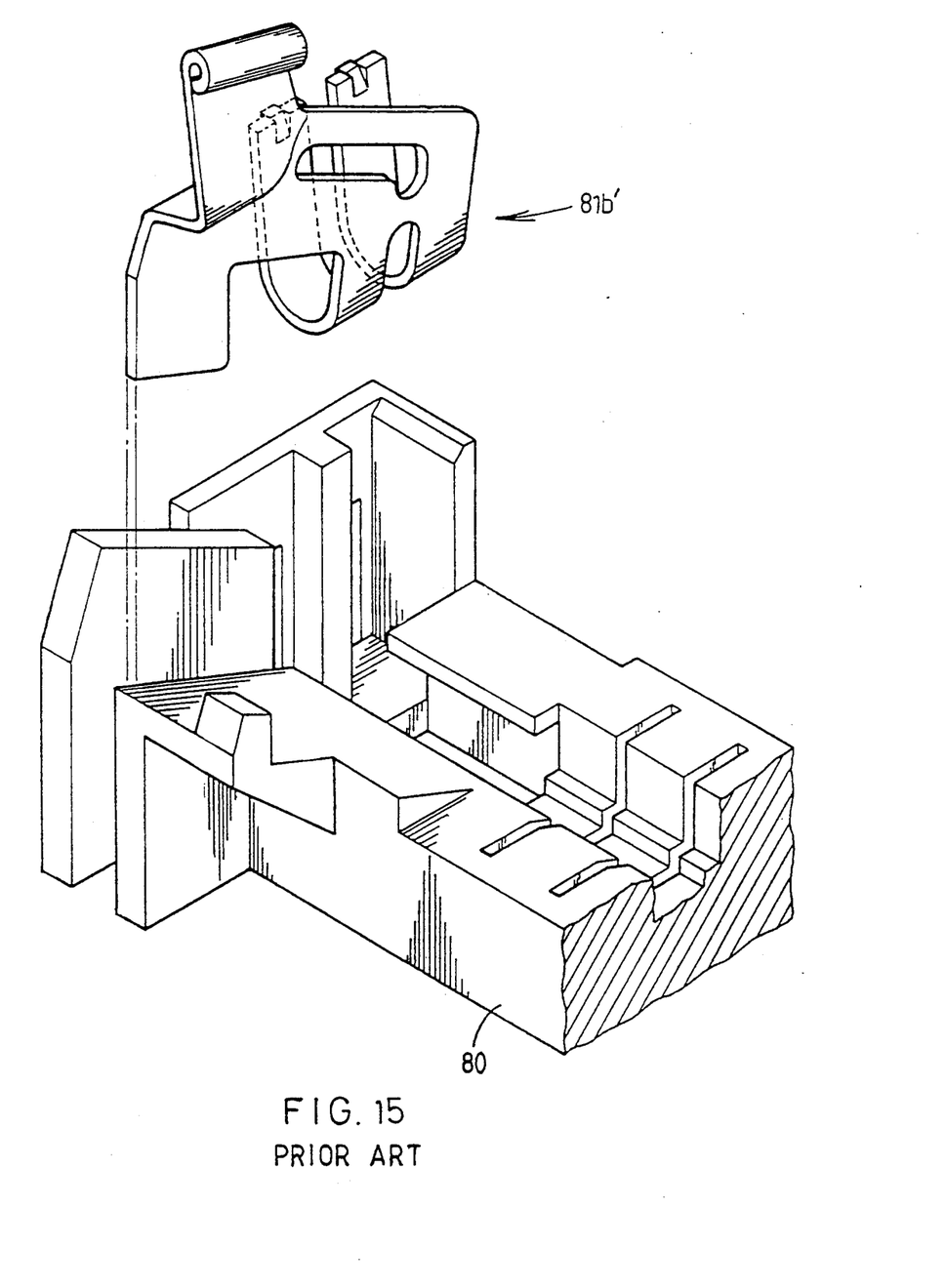
FIG. 15 is a perspective view of another slant memory module socket of the prior art.

FIG. 14 illustrates latches (81a)(81b) of a conventional slant socket for a memory module. The insulative housing (80) is made of an engineering plastic and is shaped by injection molding. When a user wants to remove a module (not illustrated), he has to pull open latches (81a)(81b) outwardly. This makes latches (81a)(81b) easy to break, difficult to use, and impossible to be used continuously over long periods of time. As illustrated in FIG. 15, although metal latch (81b') has been substituted for original latch (81b), and above problems are partly solved, yet other problems as described hereafter are not solved.

As shown in FIG. 14, two positioning cylindrical pegs (82a)(82b) are disposed on the bottom side of the insulative housing (80) and are used for insertion into corresponding holes on a printed circuit board (not shown, for example, a computer CPU board) so as to secure insulative housing (80) in a fixed position. After the two cylindrical pegs (82a)(82b) of the insulative housing (80) are respectively inserted into corresponding holes on a printed circuit board, they have to be welded in a tin-welding furnace. That is, a terminal leg (not shown) which extends downward from a slot has to be welded to the printed circuit board. Because liquid tin will flow upward during the welding process and push the insulative housing upward, connections between the insulative housing (80) and printed circuit board will be disrupted so that the insulative housing (80) can not be firmly secured and positioned on the printed circuit board.

A circuit board socket connector is illustrated in FIGS. 5 and 6 of U.S. Pat. No. 4,832,617, which includes fulcrum leg (41) and contact leg (42) of the contact (25) respectively extending from base (40) upwardly, so these two legs (41)(42) cannot contact each other. These legs (41)(42) are too short to disperse stress effectively and are thus easily subject to elastic fatigue or permanent deformation.

In view of the problems with the prior art, one object of the present invention is to provide a slant memory module socket in which the positioning peg and latch are made of an elastic material and are shaped by injection molding so that they may firmly insert in an insulated base.

Another object of the present invention is to provide a slant memory module socket which enables an insulative housing to be securely retained on a printed circuit board and which enables the separation between the bottom surface of the insulative housing and the upper surface of the printed circuit board to keep within desired values.

A further object is to provide a slant memory module socket which allows contact elements to disperse stress more effectively and enables two contactors to averagely apply contact pressure to a memory module.

SUMMARY OF THE INVENTION

The slant memory module socket of the present invention includes an insulative housing which has a bottom side for contacting to an upper surface of a printed circuit board. Along the vertical direction of the insulative housing as illustrated in the drawings there is disposed a long groove and along the long groove are disposed a plurality of short grooves which are spaced apart in order along the long groove. The short grooves are perpendicular to the long groove. At the end portions of each insulative housing positioning arms are respectively disposed which are vertical to the longitudinal axis of the insulative housing and which form a slant angle with respect to the bottom side of the insulative housing.

The positioning arms have bosses protruding from their ends.

The slant memory module socket of the present invention further includes:

(a) At least two mounting portions, which extend from both ends of the insulative housing. The mounting portions each have a first mounting hole and a second mounting hole. The first mounting hole connects with the second mounting hole. The first and the second mounting holes penetrate through mounting portions and are vertical to the bottom side of the insulative housing as illustrated. The sectional shape of first mounting hole is different from that of the second mounting hole. The second mounting hole has a mounting groove; and (b) At least two inserting members defined by mounting walls described below. Each inserting member has a retaining portion. Each retaining portion has at least two snaps, which can be inserted in the mounting grooves and secured in this position.

Positioning members extending downward from the mounting portions include at least two positioning pieces and are spaced along a circumference of the insulative housing. The positioning pieces can snap independently and include a smaller neck portion, a bigger shoulder portion, and a tapered guiding portion. The neck portion is located between shoulder and guiding portion, which is located at the free end of positioning piece so as to be insertable into a positioning hole of the printed circuit board and retained therein securely. The guiding portion allows the positioning peg to be removed from the positioning hole under the application of a sufficient force.

A latching portion extends upwardly from said mounting portion and includes flexible portions extending at an angle from the mounting portion, a latch extending laterally from the flexible portion, and including a planar latch which is parallel to the long groove, and a guide which is at an angle to the planar latch so as to slidingly guide a module into the planar latch. The latching portion also includes an unlatching portion which extends at an angle from the flexible portion and which can be pressed to allow the latch to move away from the positioning boss.

The slant memory module socket of the present invention further includes a plurality of contact elements respectively inserted into the short grooves of the insulated base, each of the contact elements comprises a "U" shaped base having two ends at its upper portion.

Each contact element further comprises a semi-circular pinching portion having two contact element ends for pinching both sides of the printed circuit board. The semi-circular pinching portion is elastic and suspended in the "U" shaped base portion. Each contact element further comprises an "L" shaped elastic connecting portion having an end which connects to the bottom of the semi-circular pinching portion. The "L" shaped elastic connecting portion extends downward and then turns upward so that the other end thereof can connect to one end of the "U" shaped base so as to suspend the semi-circular pinching portion in the "U" shaped base.

The positioning snap of the slant memory module socket extends downwardly as a whole from the insulative housing, not from the inserting member. In addition, the inserting member does not have a positioning snap. The positioning snap can be injection molded on the mounting portion of the insulative housing.

DETAILED DESCRIPTION OF THE PREFERRED EMBODIMENT

Figure 1:
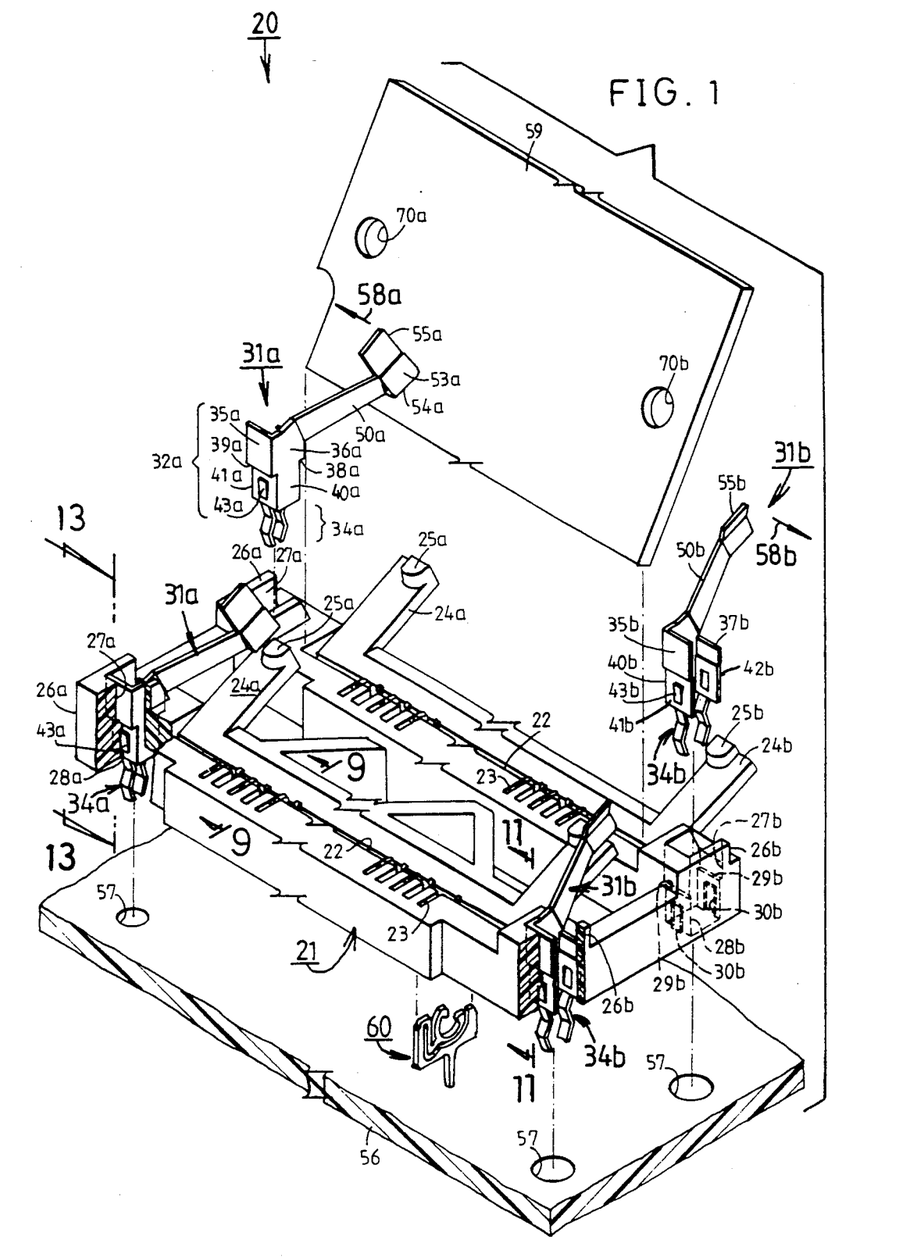
FIG. 1 is a broken perspective view of the present invention.
Figure 2:
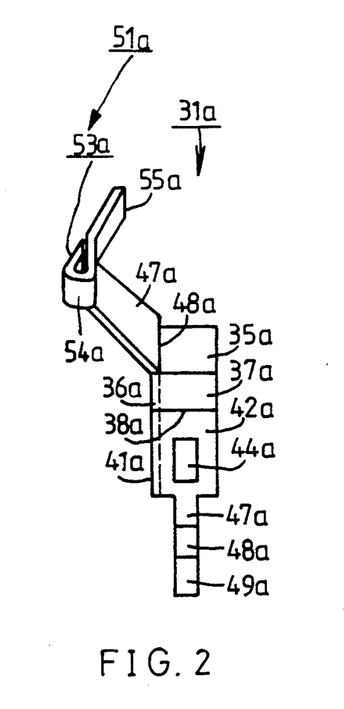
FIG. 2 is a right side view of the left end inserting member in accordance with the present invention.
Figure 3:
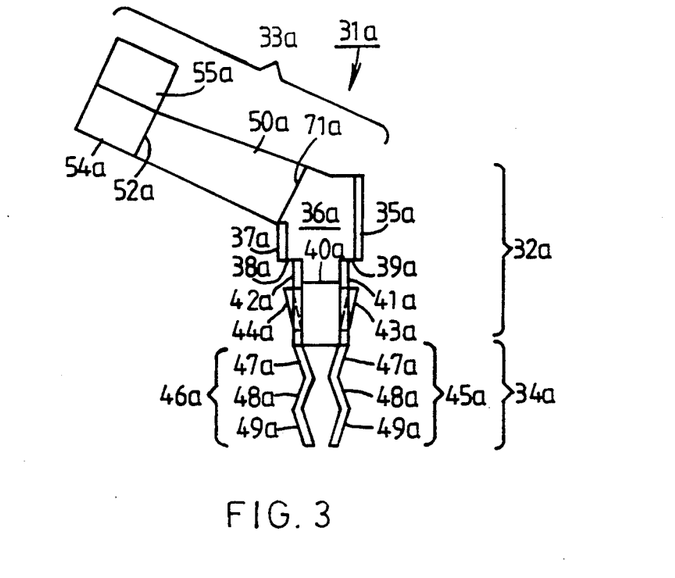
FIG. 3 is a back side view of the left end inserting member in accordance with the present invention.
Figure 4:
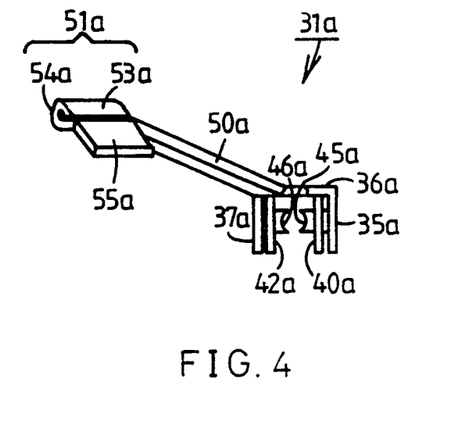
FIG. 4 is a planar view of the left end inserting member in accordance with the present invention.
Figure 5:
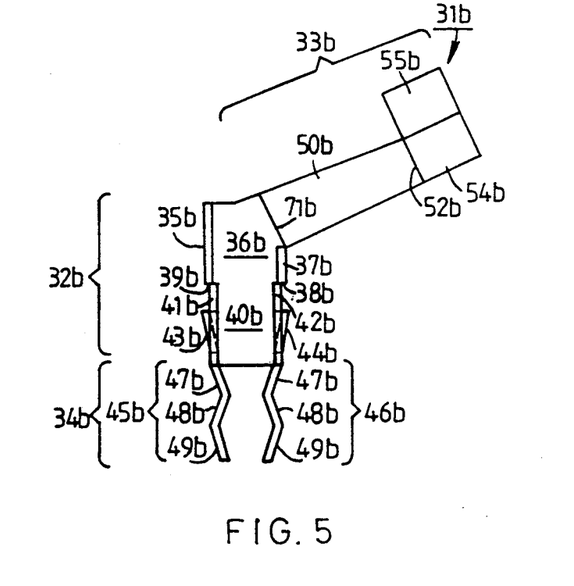
FIG. 5 is a back view of the right end inserting member in accordance with the present invention.
Figure 6:
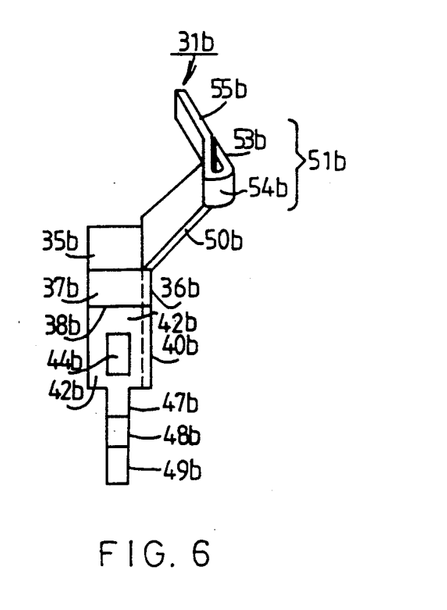
FIG. 6 is a left side view of the right end inserting member in accordance with the present invention.
Figure 7:
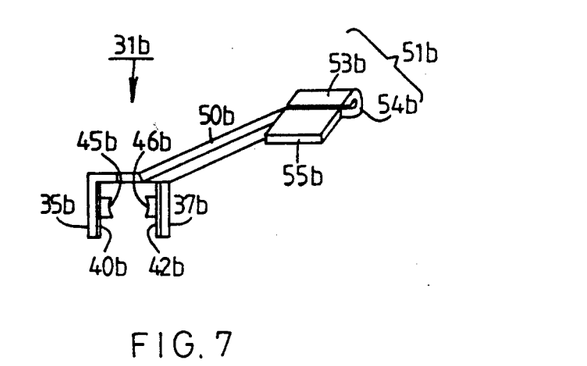
FIG. 7 is a planar view of the right end inserting member in accordance with the present invention.

Now referring to FIG. 1, the slant socket memory module of the present invention includes an insulative housing (21) which has an elongate or groove (22) along the longitudinal direction as illustrated and slots (23) along the elongate or groove (22). Positioning arms (24a)(24b) extend slantly upward from both ends of said insulative housing (21). Positioning bosses (25a)(25b) extend upward from positioning arms (24a)(24b).

Figure 11:
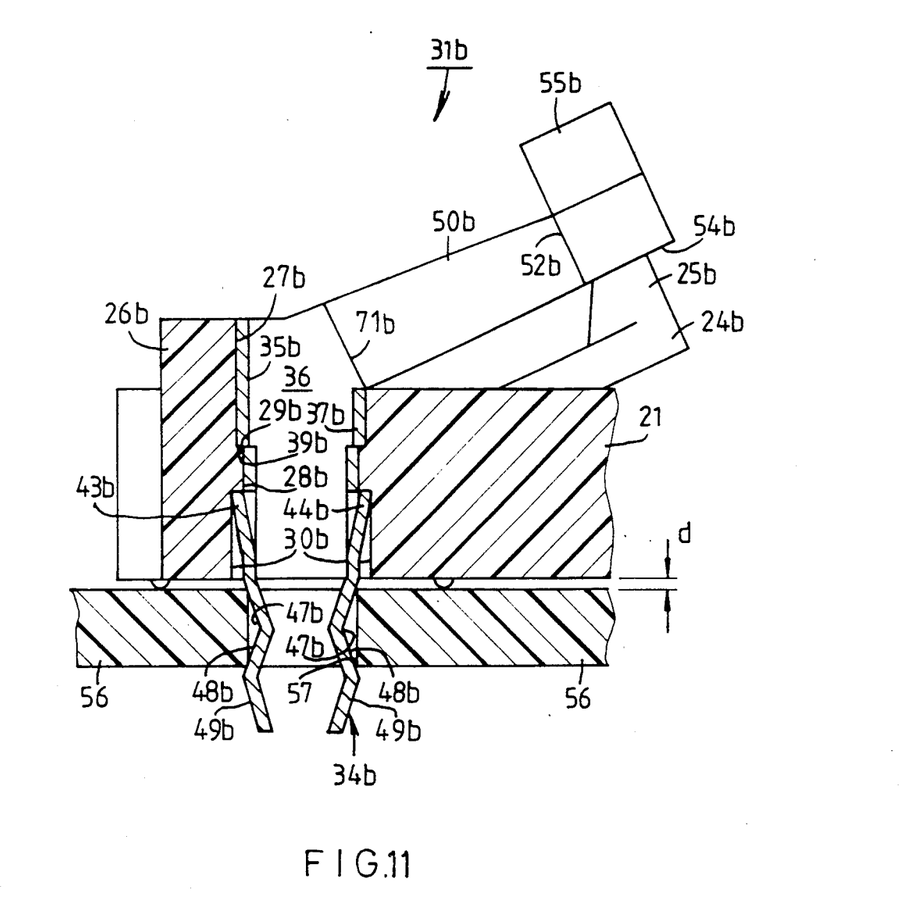
FIG. 11 is a sectional view taken along the cut line 11—11 of FIG. 1.

There are two mounting portions (26a)(26b) which extend vertically upward from both ends of insulative housing (21) as illustrated. Along the mounting portions (26a)(26b) there is disposed a crossed gradient rectangular hole which is also vertical to the insulative housing (21). As illustrated in FIGS. 1 and 11, an upper section of the crossed gradient rectangular hole defines the first mounting holes (27a)(27b); the lower section of said cross gradient rectangular hole defines the second mounting holes (28a)(28b). The first mounting holes (27a)(27b) of the upper section are longer and wider than the second mounting holes (28a)(28b) of the lower section. Therefore, between these holes there are formed shoulders (29a)(29b). At both sides of second mounting holes (28a)(28b) of the lower section there are respectively disposed mounting grooves (30a)(30b) (as shown in FIGS. 1 and 11).

As illustrated in FIGS. 2-7, metal inserting member (31a)(31b) includes retaining portions (32a)(32b), latches (33a)(33b), and positioning pegs (34a)(34b). Each of the retaining portions (32a)(32b) has three walls (35a)(36a)(37a)(35b)(36b)(37b) under which there are two edging portions (38a)(39a)(38b)(39b). From the mounting walls (36a)(36b) there extends other mounting walls (40a)(40b) respectively (as shown in FIGS. 2-7). Further mounting walls (41a)(42a)(41b)(42b) respectively extend vertically from both sides of the mounting walls (40a)(40b). Each mounting snap (43a)(44a)(43b)(44b) individually extends upward from its respective mounting wall (41a)(42a)(41b)(42b) (see FIGS. 2, 3, 5 and 6). Each positioning piece (45a)(46a)(45b)(46b) individually extends downward from both walls (40a)(42a)(40b)(42b). These two positioning pieces are mutually symmetrical to each other, and they have smaller necks (47a)(47b), bigger shoulders (48a)(48b), and tapered guiding portions (49a)(49b). In further embodiments the positioning pieces can be made of three or more than three pieces.

As illustrated in FIGS. 2-7, there are two flexible portions (50a)(50b) which extend at an angle from the mounting walls (36a)(36b). Along the turning lines (71a)(71b) inwardly turned latches (51a)(51b) extend from flexible portions (50a)(50b). The latches (51a)(51b) turn outwardly along turning lines (52a)(52b) and have guiding slants (53a)(53b) and planar latches (54a)(54b). Unlatching portions (55a)(55b) extend upward from latches (51a)(51b) so that users can easily pull them open by hand.

In use, as illustrated in FIGS. 1 and 11, walls (35a)(36a)(37a)(35b)(36b)(37b) of inserting members (31a)(31b) insert through first mounting holes (27a)(27b). At the same time, retaining portions having two mounting snaps (43a)(44a, (43b)(44b) are respectively inserted in mounting grooves (30a)(30b) and mounting walls (40a)(41a)(42a)(40b)(41b)(42b) are inserted into second mounting holes (28a)(28b). The upper ends of the two mounting snaps (43a)(44a)(43b)(44b) push against mounting grooves (30a)(30b) respectively so that inserting members (31a)(31b) will not drop off.

As illustrated in FIGS. 1-7 and 11, positioning pegs (34a)(34b), which in use are inserted into positioning holes (57) on printed circuit board (56), rely upon the elasticity of two positioning pieces (45a)(46a, (45b)(46b) to retain necks (47a)(47b) in the positioning holes (57) and to maintain a gap or spacing "d" between the bottom surface of insulative housing (21) and the front surface of printed circuit board (56). In this manner, in the tin welding furnace, the upward fluid dynamics of melted or liquid tin will not extend across the gap or spacing "d" and this gap or spacing "d".

After inserting members (31a)(31b) are secured to circuit board (56), memory module (59) can slide over guiding slants (53a)(53b) into position, after which planar latches (54a)(54b) retain the module (59). By pressing down unlatching portions (55a)(55b) to move along the arrow-pointed direction (58a)(58b), planar latches (54a)(54b) will move away from contract with the module (59) so that module (59) can be removed.

Figure 12:
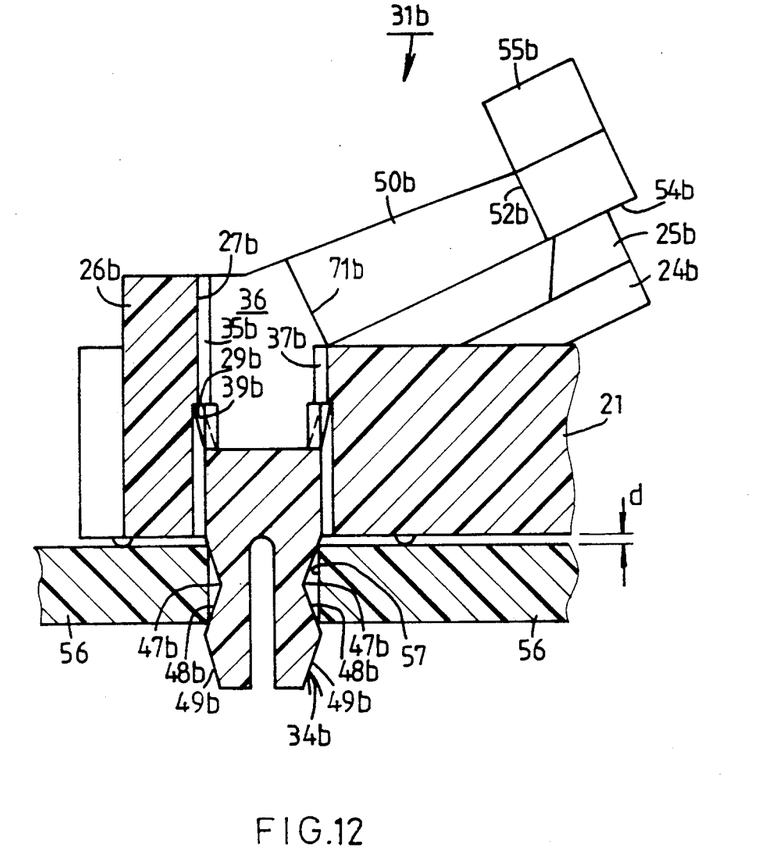
FIG. 12 is a view of a cylindrical positioning peg according to another embodiment of the present invention.

FIG. 12 shows another embodiment in which positioning pegs (34a)(34b) are extensions of the insulated base (FIG. 12 only shows one of its positioning pegs).

Figure 8:
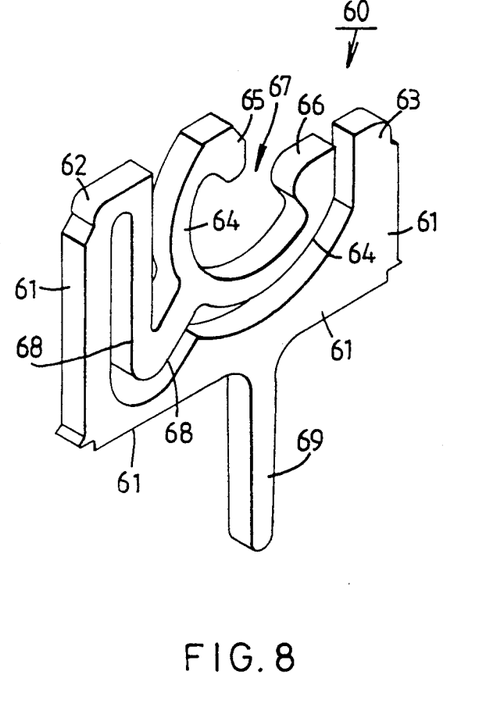
FIG. 8 is a perspective view of a contact element in accordance with the present invention.
Figure 9:
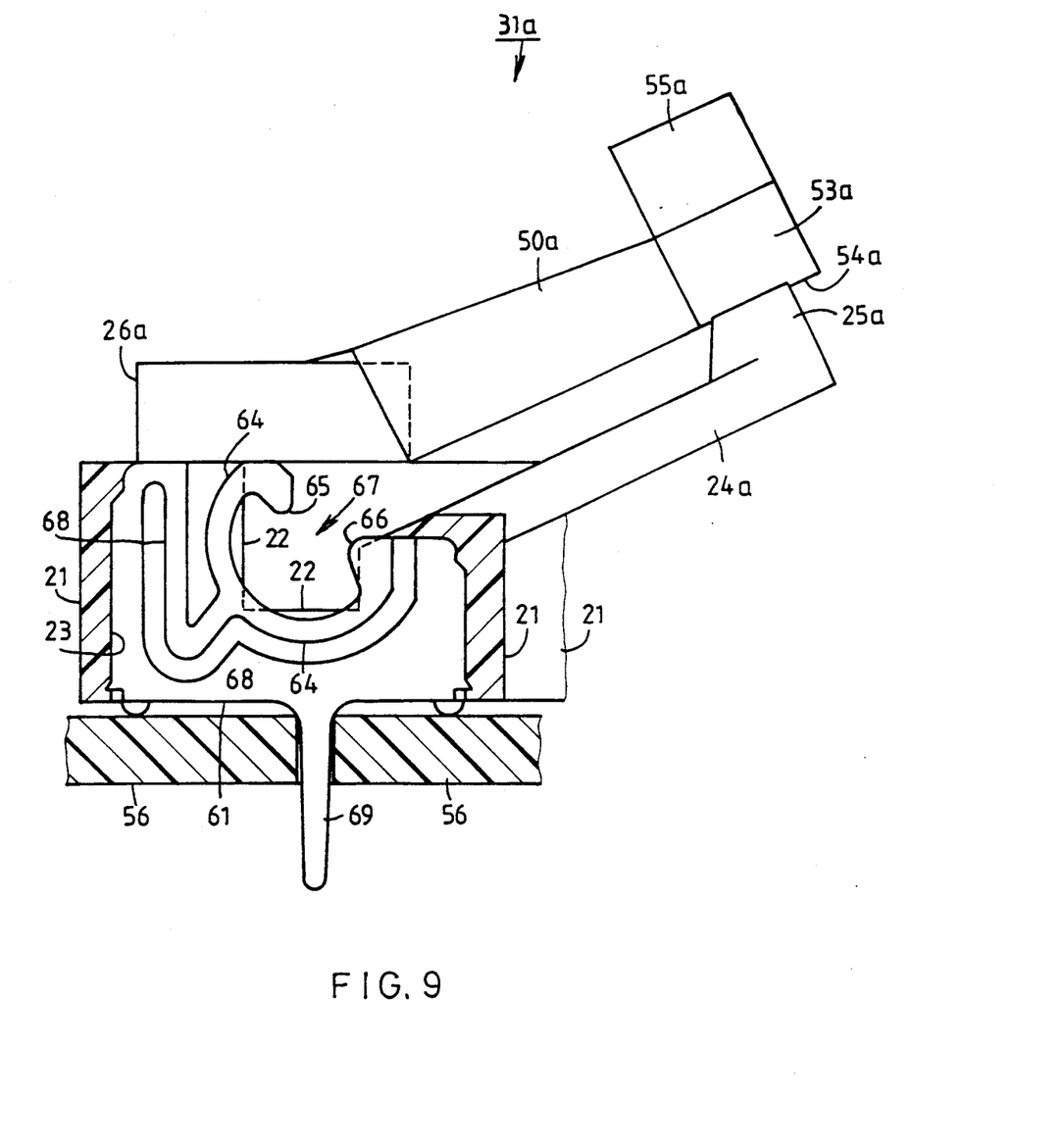
FIG. 9 is a sectional view of FIG. 1 along the cut line 9—9.
Figure 10:
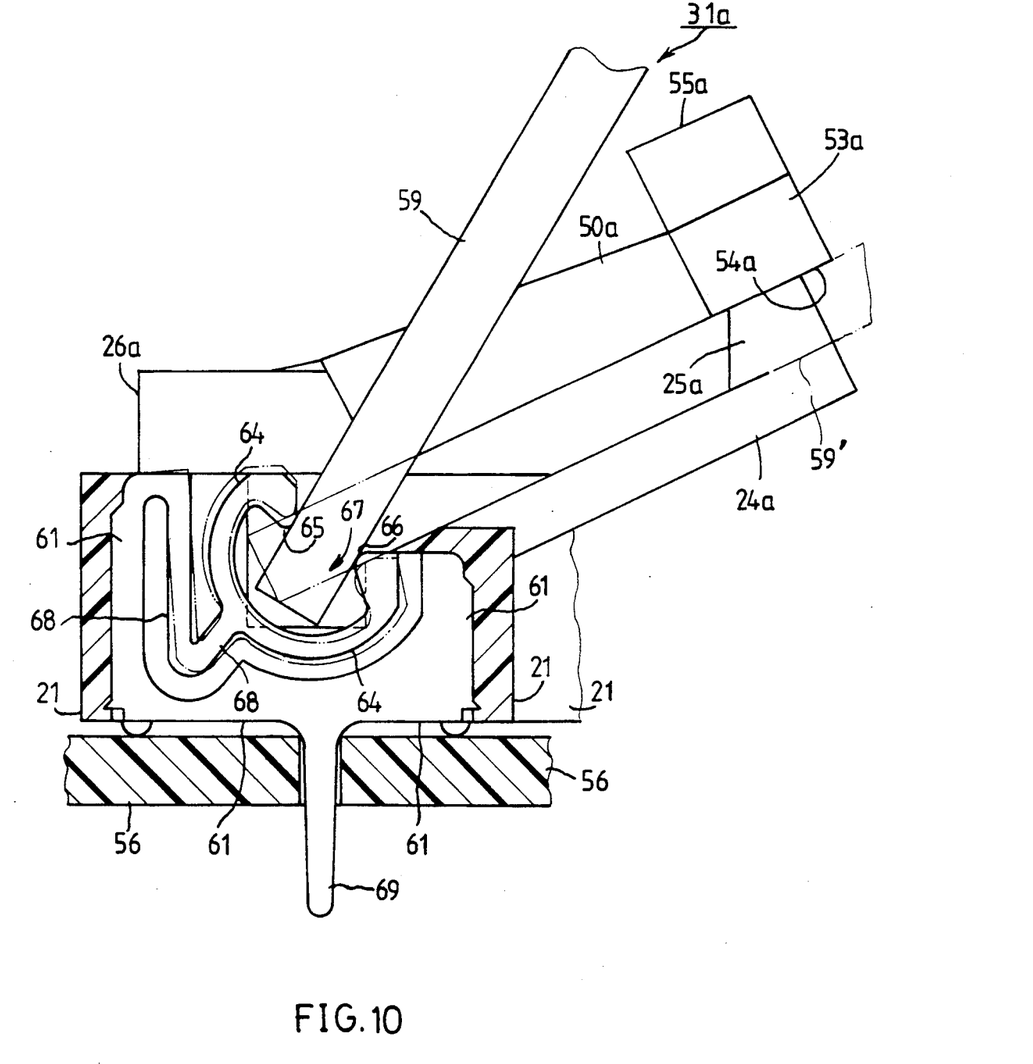
FIG. 10 is a sectional view of a memory module in FIG. 9 at the inserting position.

FIGS. 1 and 8 show contact element (60) which comprises "U" shaped base (61) with two ends (62)(63) and a leg (69) which extends downward from its center. A semi-circular pinching portion (64) is provided which has contact portions (65)(66) at its two ends. Between the contract portions there is formed a slant opening (67) in which module (59) is inserted. Contact portions (65)(66) can respectively pinch both sides of a printed circuit board. The bottom of semi-circular pinching portion (64) connects with one of the ends of base (61).

Figure 13:
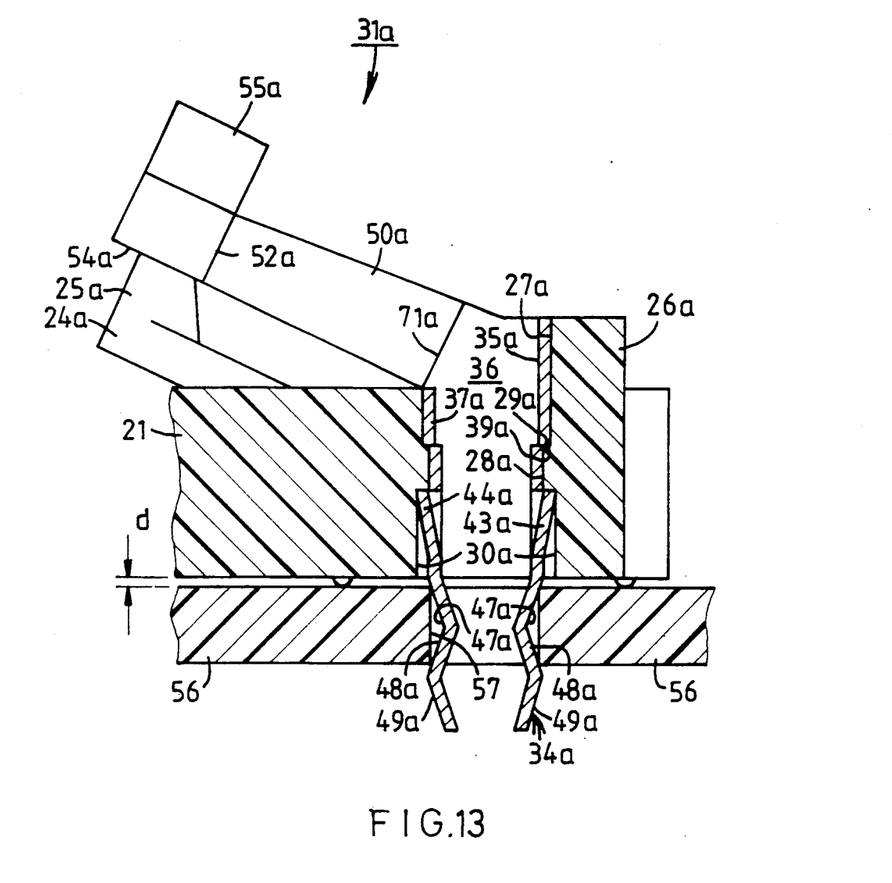
FIG. 13 is a sectional view taken along the cut line 13—13 of FIG. 1.

As illustrated in FIG. 13, when module (59) is inserted into opening (67) and turned to the position (59'), its two positioning holes (70a)(70b) (see FIG. 1) respectively match with two positioning bosses (25a)(25b), and contact portions (65)(66) of contact element (60) are pressed apart by a force so as to apply a pinching force on module (59). Partly because semi-circular pinching portion (64) and "L" shaped flexible connecting portion (68) are connected and suspended in the "U" shaped base (61), and partly because pinching portion (64) itself has elasticity, the inner stress of pinching portion (64) and flexible connecting portion (68) can be averagely dispersed to each part thereof so that there will be little possibility for either part to experience plastic deformation or transformation. Moreover, this enables two contact portions (65)(66) to more effectively contact with memory module (59).

According to the present invention, each inserting member (31a)(31b) has retaining portions (32a)(32b), latching portions (33a)(33b), and positioning pegs (34a)(34b). This structure is unique.

Another unique feature of the present invention is the manner in which the positioning pegs (34a)(34b) function to secure the insulative housing on the printed circuit board (56) and maintain a gap or spacing between the housing and circuit board which remains unchanged during a tin welding process. According to the present invention, if a connector is damaged, it can be easily removed from main printed circuit board (56).

In contrast to the present invention, in conventional technology, when one end leg is welded to a printed circuit board, positioning cannot be maintained on the circuit board and the connector will float upward because molten or liquid tin tends to flow upward. To solve this problem, a lead piece has to be placed and press on the connector. This causes great inconvenience. The present invention uses positioning pegs (34a)(34b) to secure the insulative housing on a printed circuit board. The positioning pegs (34a)(34b) allow the insulative housing to be removed from the circuit board. It is very convenient.

In the present invention, semi-circular pinching portion (64) is suspended in "U" shaped base (61) by means of "L" shaped flexible connecting portion (68), so that two contact portions (65)(66) can averagely apply force on module (59). This provides a better contact between the contact portions and module than previously achieved by the prior art.

Use of the "L" shaped flexible connecting portion (68) to connect semi-circular pinching portion (64) and "U" shaped base (61) effectively disperses stress to the "L" shaped flexible connecting portion (68) so that it will not deform or transform.

What is claimed is:

1. In a slant memory module socket assembly comprising:
   an insulative housing having a bottom side for contacting to an upper surface of a printed circuit board, an elongate groove extending lengthwise along said insulative housing and a plurality of grooves spaced apart along said elongate groove and perpendicular to said elongate groove;
   positioning arms at end portions of said insulative housing which are perpendicular to a longitudinal axis of said insulative housing and which are at an angle with respect to said bottom side of said insulative housing, said positioning arms having bosses protruding from ends thereof, the improvement wherein said slant memory module socket further comprises:
   (a) at least two mounting portions extending from said end portions of said insulative housing, said mounting portions each having a first mounting hole and a second mounting hole, said first mounting hole connecting with said second mounting hole, the sectional shape of said first mounting hole being different from that of said second mounting hole, said second mounting hole having mounting grooves;
   (b) at least two inserting members, each inserting member having a retaining portion, each retaining portion having at least two snaps, which are insertable in said mounting grooves, positioning pegs extending downward from said mounting portions having at least two positioning pieces, each of said positioning pieces including a positioning peg having a neck portion, a shoulder portion, and a tapered guiding portion, said positioning pegs being insertable into holes provided on said printed circuit board to be retained therein, a latching portion extending from each of said mounting portions each latching portion comprising a flexible portion extending at an angle from said mounting portion, a latch extending laterally from said flexible portion, and including a planar latch which is parallel to said elongate groove, and a guiding slant which is at an angle with respect to said planar latch so as to slidingly guide a module into said planar latch, said latching portion further includes an unlatching portion which extends at an angle from said flexible portion and which when pressed allows said latch to move away from said positioning boss.

2. A slant memory module socket assembly as claimed in claim 1, further including a plurality of contact elements respectively inserted into said plurality of grooves of said insulating base, each of said contact elements comprising a "U" shaped base having two ends at an upper portion thereof, said contact element further comprising:

a semi-circular pinching portion having two contact element ends for pinching both sides of said printed circuit board, said semi-circular pinching portion being elastic and suspended in said "U" shaped base by an "L" shaped elastic connecting portion which includes an end connected to a bottom of said semi-circular pinching portion, and another end connected to one of said two ends of said "U" shaped base.

3. A slant memory module socket assembly as claimed in claim 1, wherein said at least two snaps downwardly extending from said insulated housing said at least two snaps are injection molded on said mounting portion of said insulative housing.

* * * * *